(12) United States Patent
Ahrari et al.

(10) Patent No.: US 9,325,360 B2
(45) Date of Patent: Apr. 26, 2016

(54) REDUCING NON-LINEARITIES IN A DIFFERENTIAL RECEIVER PATH PRIOR TO A MIXER USING CALIBRATION

(75) Inventors: Bahman Ahrari, Los Gatos, CA (US); I-Hsiang Lin, Los Altos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1000 days.

(21) Appl. No.: 12/892,702

(22) Filed: Sep. 28, 2010

(65) Prior Publication Data

US 2012/0077453 A1 Mar. 29, 2012

(51) Int. Cl.
| | |
|---|---|
| H04B 1/10 | (2006.01) |
| H03F 1/32 | (2006.01) |
| H03F 3/45 | (2006.01) |
| G06F 3/033 | (2013.01) |

(52) U.S. Cl.
CPC .............. H04B 1/109 (2013.01); H03F 1/3211 (2013.01); H03F 3/45188 (2013.01); *H03F 2200/294* (2013.01); *H03F 2203/45048* (2013.01); *H03F 2203/45112* (2013.01); *H03F 2203/45386* (2013.01)

(58) Field of Classification Search
CPC ..................... H03F 2200/294; H03F 2200/372; H03F 1/26; H03F 2203/45048; H04B 1/109; H04B 1/30; H04B 1/12; H04B 17/004; H04B 1/16; H03D 2200/0088
USPC .......... 455/114.3, 341, 501, 63.1, 67.13, 295, 455/334; 330/261, 285, 296
See application file for complete search history.

(56) References Cited

U.S. PATENT DOCUMENTS

| | | | |
|---|---|---|---|
| 6,175,279 B1 * | 1/2001 | Ciccarelli et al. ............. | 330/296 |
| 6,992,519 B2 | 1/2006 | Vilander et al. | |
| 7,561,862 B2 | 7/2009 | Woo-nyun | |
| 7,657,241 B2 | 2/2010 | Shah | |
| 8,035,447 B2 | 10/2011 | Liu et al. | |
| 8,149,955 B2 * | 4/2012 | Tired ............................. | 375/318 |
| 2003/0148751 A1 * | 8/2003 | Yan et al. ...................... | 455/318 |
| 2003/0186664 A1 * | 10/2003 | Shah ........................... | 455/232.1 |
| 2006/0055445 A1 * | 3/2006 | Khajehpour ................... | 327/359 |
| 2006/0234664 A1 * | 10/2006 | Chiu et al. ..................... | 455/285 |
| 2007/0049215 A1 | 3/2007 | Chen et al. | |
| 2007/0132500 A1 * | 6/2007 | Embabi ................ | H03D 7/1441 327/359 |

(Continued)

FOREIGN PATENT DOCUMENTS

| | | |
|---|---|---|
| EP | 2197119 B1 | 2/2013 |
| JP | 08008775 | 1/1996 |

(Continued)

OTHER PUBLICATIONS

English Translation of WO 2008012962 A1, Jan. 31, 2008, Yoneya in PDF file format.*

(Continued)

*Primary Examiner* — Ayodeji Ayotunde
(74) *Attorney, Agent, or Firm* — Rupit M. Patel

(57) ABSTRACT

A receiver for a wireless device is described. The receiver includes a low noise amplifier that includes differential inputs. The receiver also includes a mixer coupled to the low noise amplifier. The receiver further includes second-order intermodulation reduction circuitry coupled to a stage subsequent to the low noise amplifier. The second-order intermodulation reduction circuitry provides a biasing of the differential inputs.

38 Claims, 9 Drawing Sheets

(56) References Cited

U.S. PATENT DOCUMENTS

| | | | |
|---|---|---|---|
| 2007/0173220 A1* | 7/2007 | Kim et al. | 455/296 |
| 2007/0184782 A1* | 8/2007 | Sahota et al. | 455/63.1 |
| 2007/0262817 A1* | 11/2007 | Ciccarelli et al. | 330/278 |
| 2008/0039045 A1* | 2/2008 | Filipovic et al. | 455/295 |
| 2009/0075622 A1 | 3/2009 | Zhuo et al. | |
| 2009/0154377 A1* | 6/2009 | Tsuda et al. | H03G 3/3042 370/277 |
| 2009/0189691 A1* | 7/2009 | Deng et al. | 330/149 |
| 2011/0299575 A1* | 12/2011 | Aoulad Ali et al. | 375/219 |

FOREIGN PATENT DOCUMENTS

| | | | | |
|---|---|---|---|---|
| WO | 2008012962 A1 | 1/2008 | | |
| WO | WO 2008012962 A1 * | 1/2008 | | H04B 1/30 |
| WO | WO 2010066579 A1 * | 6/2010 | | |

OTHER PUBLICATIONS

International Search Report and Written Opinion—PCT/US2011/053612—ISA/EPO—Feb. 29, 2012.

* cited by examiner

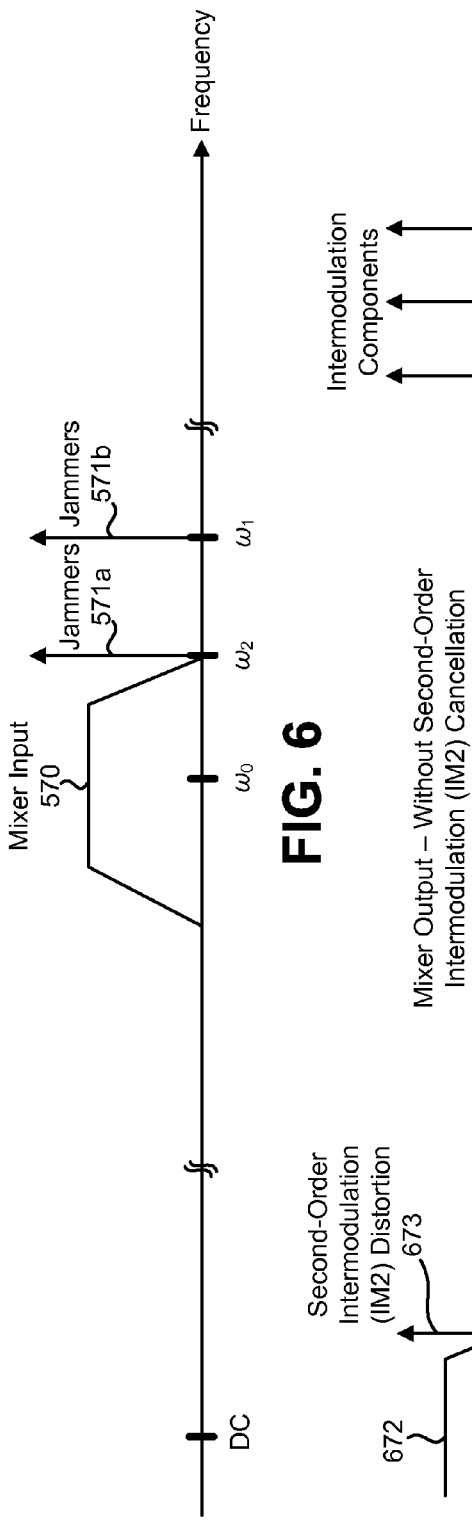
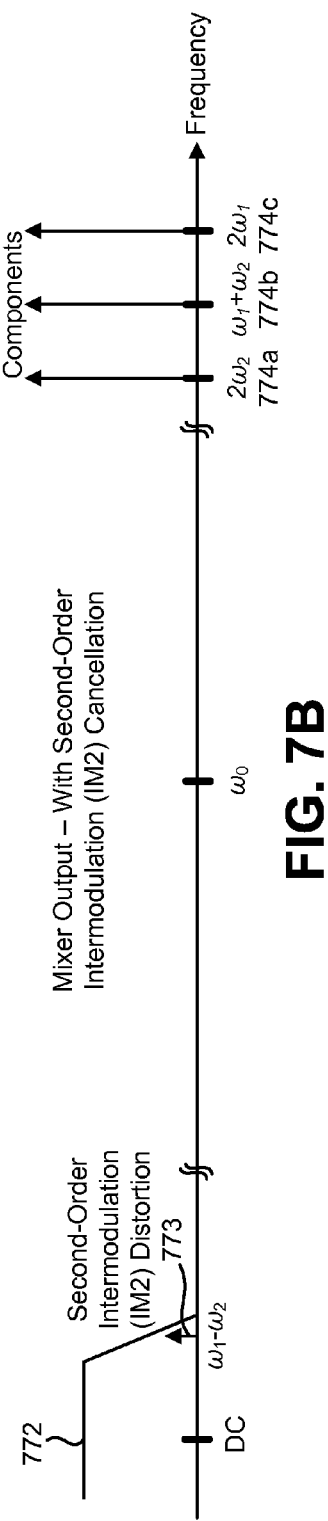
FIG. 6
FIG. 7A
FIG. 7B

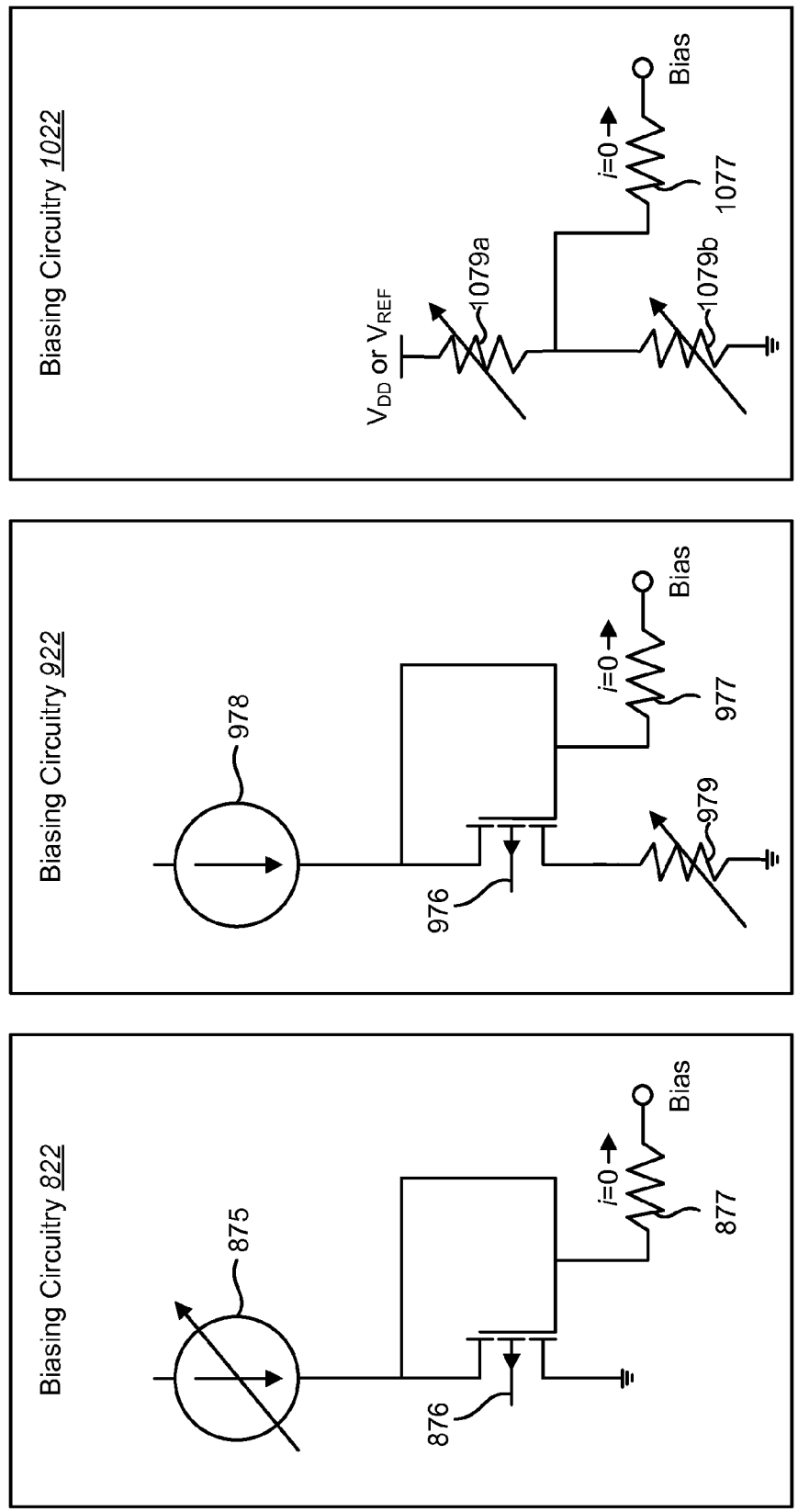

REDUCING NON-LINEARITIES IN A DIFFERENTIAL RECEIVER PATH PRIOR TO A MIXER USING CALIBRATION

TECHNICAL FIELD

The present disclosure relates generally to wireless communication systems. More specifically, the present disclosure relates to systems and methods for reducing non-linearities in a differential receiver path prior to a mixer using calibration.

BACKGROUND

Wireless devices have become smaller and more powerful in order to meet consumer needs and to improve portability and convenience. Consumers have become dependent upon wireless devices such as cellular telephones, personal digital assistants (PDAs), laptop computers and the like. Consumers have come to expect reliable service, expanded areas of coverage and increased functionality.

A wireless device may use a receiver to receive wireless communications. A receiver may use various circuitry components to convert the received wireless communications into a usable format. Such circuitry components may include mixers, amplifiers, filters, analog-to-digital converters (ADCs) and digital signal processors (DSPs). Each circuitry component may include linear and non-linear portions. Thus, a circuitry component may introduce non-linearities into the received signal, decreasing the sensitivity of the receiver.

Filters have been used to remove some of the non-linearities. However, some non-linearities are too close to the desired signal to be removed using filters. Benefits may be realized by improved methods for removing the non-linearities introduced into a received signal from circuitry components.

BRIEF DESCRIPTION OF THE DRAWINGS

FIG. 6 shows an exemplary mixer input signal and jammer frequencies;

FIG. 7A shows the output of a mixer without second-order intermodulation (IM2) cancellation;

FIG. 7B shows an exemplary output of a mixer with second-order intermodulation (IM2) cancellation;

FIG. 8 is a circuit diagram illustrating exemplary biasing circuitry for use in the present systems and methods;

FIG. 9 is a circuit diagram illustrating additional biasing circuitry in an exemplary embodiment;

FIG. 10 is a circuit diagram illustrating more biasing circuitry for use in the present systems and methods;

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
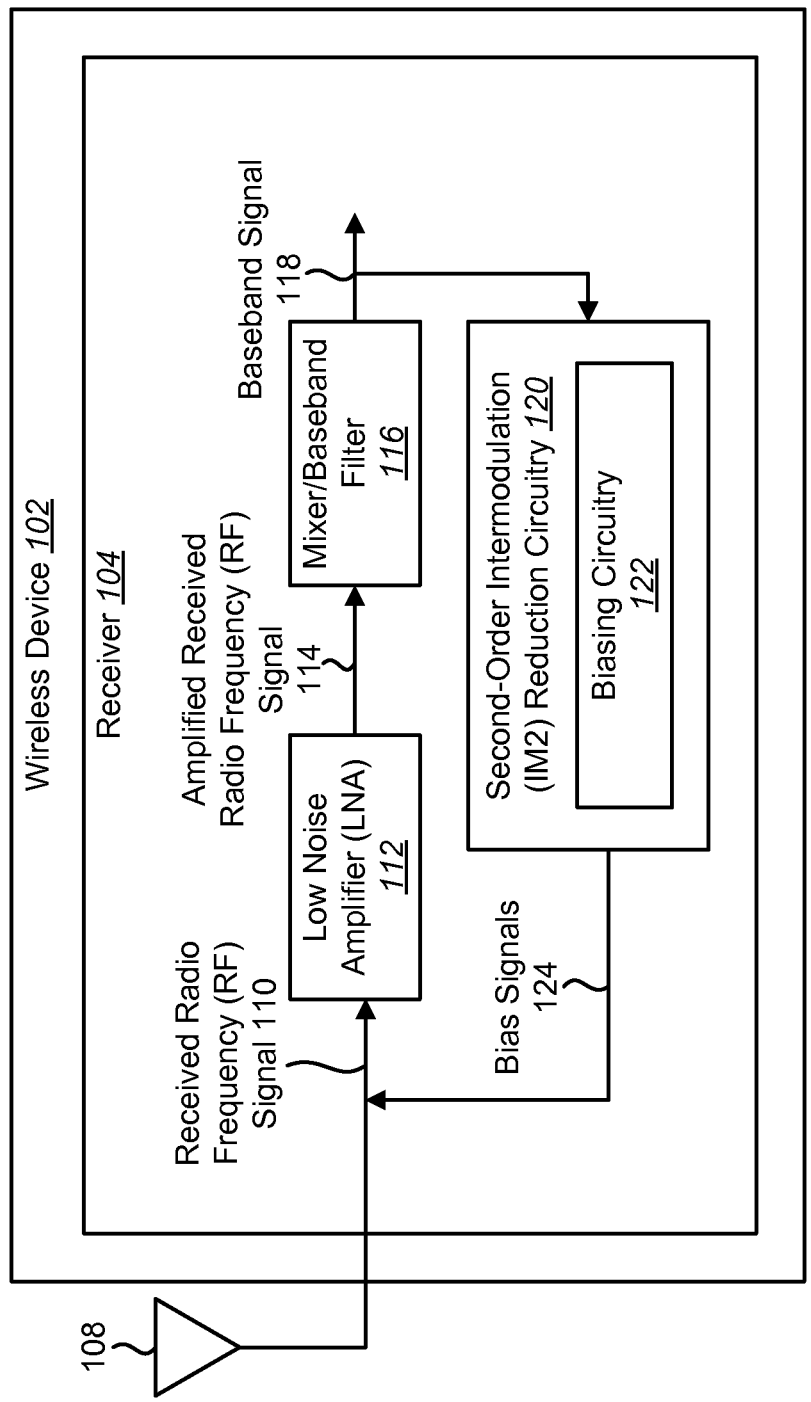
FIG. 1 shows a wireless device for use in the present systems and methods.

FIG. 1 shows a wireless device 102 for use in the present systems and methods. In an exemplary embodiment, a wireless device 102 may be a base station, a wireless communication device, a controller or the like. A base station is a station that communicates with one or more wireless communication devices in a wireless communication system. A base station may also be referred to as, and may include some or all of the functionality of, an access point, a broadcast transmitter, a Node B, an evolved Node B, etc. The term "Base Station" will be used herein. Each base station provides communication coverage for a particular geographic area. A base station may provide communication coverage for one or more wireless communication devices. The term "cell" can refer to a base station and/or its coverage area, depending on the context in which the term is used.

A wireless communication device may also be referred to as, and may include some or all of the functionality of, a terminal, an access terminal, a user equipment (UE), a subscriber unit, a station, etc. An exemplary wireless communication device may be a cellular phone, a smart phone, a personal digital assistant (PDA), a wireless device, a wireless modem, a handheld device, a laptop computer, etc. A wireless communication device may communicate with zero, one or multiple base stations on the downlink and/or uplink at any given moment. The downlink (or forward link) refers to the communication link from a base station to a wireless communication device, and the uplink (or reverse link) refers to the communication link from a wireless communication device to a base station.

Wireless communication systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems and spatial division multiple access (SDMA) systems.

The wireless device 102 may include an exemplary receiver 104. The receiver 104 may receive a transmitted radio frequency (RF) modulated signal 110 using an antenna 108, downconvert the received radio frequency (RF) signal 110 from radio frequency (RF) to baseband, digitize the baseband signal to generate samples and digitally process the samples to recover the traffic data sent by the transmitter that transmitted the radio frequency (RF) modulated signal. An exemplary receiver 104 may include a low noise amplifier (LNA) 112, a mixer (or baseband filter) 116 and second-order intermodulation (IM2) reduction circuitry 120.

A low noise amplifier (LNA) 112 may amplify very weak signals and generate an amplified received radio frequency (RF) signal 114. An ideal low noise amplifier (LNA) 112 may amplify a received signal without introducing distortion to the received signal. An exemplary practical low noise amplifier (LNA) 112 may include non-linear components that introduce second-order intermodulation (IM2) distortion into the received signal. Other circuitry before the mixer 116 may also introduce second-order intermodulation (IM2) distortion.

An ideal mixer 116 may translate an input signal from one frequency to another frequency without distorting the input signal. However, an exemplary practical mixer 116 may have non-linear characteristics that can result in the generation of second-order intermodulation (IM2) distortion in the received signal. The mixer 116 may receive an amplified received radio frequency (RF) signal 114 and output a baseband signal 118. Second-order intermodulation (IM2) is problematic because the magnitude of the second-order intermodulation (IM2) distortion may be large and fall on top of the baseband signal, thereby degrading the performance of the receiver 104.

Traditional techniques for minimizing second-order intermodulation (IM2) distortion only address the non-linearity of the mixer 116 and subsequent stages by calibrating the second-order harmonics at the input to the mixer 116. This does not correct imbalances in circuit boards or the low noise amplifier (LNA) 112. The second stage of the low noise amplifier (LNA) 112 (the stage that introduced additional gain and further isolates local oscillator (LO) leakage from the input) may be referred to as the GM (transconductance) stage. Thus, the second-order intermodulation (IM2) distortion cannot be reduced in the low noise amplifier (LNA) 112 or the board (prior to the mixer 116) using the existing methodology. For example, during the concurrency of the Wireless Wide Area Network (WWAN) (LTE) band B13 (in the 777-794 megahertz (MHz) range) with a Global Positioning System (GPS) receiver (with a center frequency of 1575.42 MHz), a low noise amplifier (LNA) 112 with second-order non-linearity may generate a second harmonic of this B13 signal that falls into the GPS band and needs to be corrected before the mixer 116. In other words, the second harmonic of the B13 band falls close to the GPS frequency.

To reduce/minimize the second-order intermodulation (IM2) distortion prior to the mixer 116, second-order intermodulation (IM2) reduction circuitry 120 may be introduced in an exemplary embodiment as feedback from the mixer 116 (or any subsequent stages such as a baseband filter, a baseband amplifier or an analog-to-digital converter (ADC)) to the input stage of the low noise amplifier (LNA) 112 in the receiver. The exemplary second-order intermodulation (IM2) reduction circuitry 120 may include biasing circuitry 122 to bias differential legs of bias signals 124 that are applied to the input stage of a differential low noise amplifier (LNA) 112. Biasing circuitry 122 is discussed in additional detail below in relation to FIGS. 8-10. The exemplary second-order intermodulation (IM2) reduction circuitry 120 may introduce programmable incremental differential bias (implemented through current or voltage) at the input stage of the differential low noise amplifier (LNA) 112 to improve the second-order intermodulation (IM2) performance of the low noise amplifier (LNA) 112.

Figure 2:
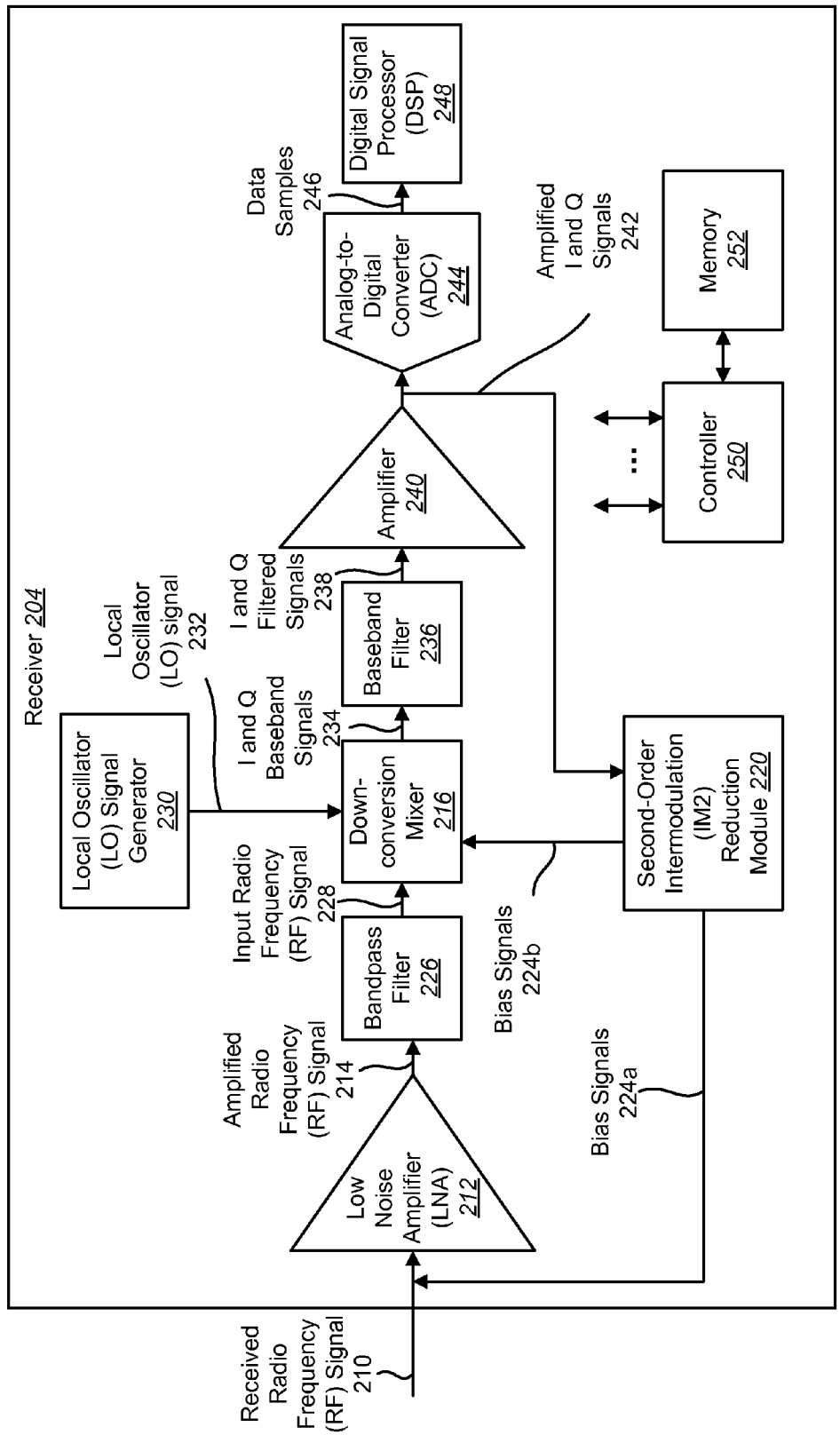
FIG. 2 is a block diagram illustrating a receiver for use in the present systems and methods.

FIG. 2 is a block diagram illustrating a receiver 204 for use in the present systems and methods. The receiver 204 of FIG. 2 may be one configuration of the receiver 104 of FIG. 1. The receiver 204 may include an exemplary low noise amplifier (LNA) 212. The low noise amplifier (LNA) 212 may amplify a received radio frequency (RF) signal 210 with a fixed or variable gain and provide an amplified radio frequency (RF) signal 214. An exemplary bandpass filter 226 may filter the amplified radio frequency (RF) signal 214 and provide an input radio frequency (RF) signal 228. The optional bandpass filter 226 may pass signal components in the frequency band of interest and remove out-of-band noise and undesired signal components. In one configuration, the bandpass filter 226 may be a surface acoustic wave (SAW) filter.

A downconversion mixer 216 may frequency downconvert the input radio frequency (RF) signal 228 with inphase and quadrature (I and Q) local oscillator (LO) signals 232 from an exemplary local oscillator (LO) signal generator 230 to produce I and Q baseband signals 234. A local oscillator (LO) signal is a carrier signal at a desired frequency. The I and Q local oscillator (LO) signals 232 are 90 degrees out of phase but have the same frequency. The frequency of the I and Q local oscillator (LO) signals 232 may be selected such that the signal component in a radio frequency (RF) channel of interest is downconverted to baseband or near baseband.

A baseband filter 236 may filter the I and Q baseband signals 234 to pass the signal components in the radio frequency (RF) channel of interest and to remove noise and undesired signal components that may have been generated by the downconversion process. The baseband filter 236 may be either a lowpass filter or a bandpass filter, depending on the mode of operation. The baseband filter 236 may generate I and Q filtered signals 238. An amplifier 240 may amplify the I and Q filtered signals 238 with a fixed or variable gain to obtain amplified I and Q signals 242. An exemplary second-order intermodulation (IM2) reduction module 220 may receive the amplified I and Q signals 242 from the amplifier 240 (this may be referred to as the output of the base band filter). In an exemplary embodiment, the second-order intermodulation (IM2) reduction module 220 may instead receive the signal from an analog-to-digital converter (ADC) 244 or a digital signal processor (DSP) 248. The second-order intermodulation (IM2) reduction module 220 may then provide bias signals 224a to the low noise amplifier (LNA) 212 and bias signals 224b to the downconversion mixer 216.

An exemplary analog-to-digital (ADC) converter 244 may digitize the amplified I and Q signals 242 and provide data samples 246 to a digital signal processor (DSP) 248. The digital signal processor (DSP) 248 may perform digital signal processing (e.g., demodulation, deinterleaving, decoding) on the data samples 246, as specified by the system.

A controller 250 may direct the operations of various processing units within the receiver 204. A memory unit 252 may store data and program codes for the controller 250. FIG. 2 shows a specific design for an exemplary receiver 204. In general, a receiver 204 may perform signal conditioning using one or more stages of amplifier, filter, mixer and so on, which may be arranged differently from the design shown in FIG. 2. Furthermore, a receiver 204 may employ other circuit blocks not shown in FIG. 2.

Figure 3:
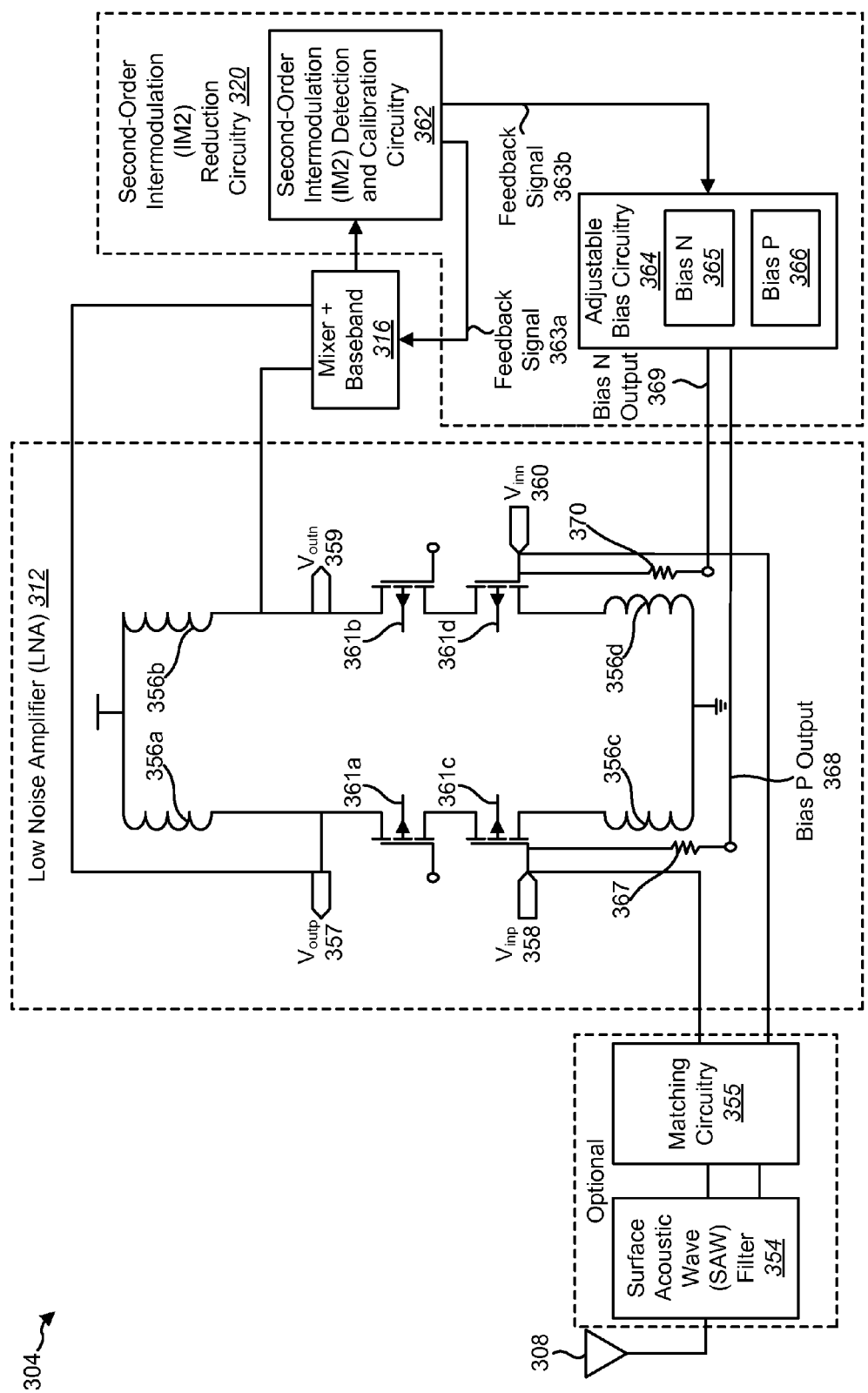
FIG. 3 is a block diagram illustrating an exemplary receiver with second-order intermodulation (IM2) reduction circuitry.

FIG. 3 is a block diagram illustrating an exemplary receiver 304 with second-order intermodulation (IM2) reduction circuitry 320. The receiver 304 of FIG. 3 may be one configuration of the receiver 104 of FIG. 1. The receiver 304 may include an antenna 308 that receives a radio frequency (RF) signal 110. An optional surface acoustic wave (SAW) filter 354 may filter the received radio frequency (RF) signal 110. In an exemplary embodiment, the SAW filter 354 may be a bandpass filter 226.

The SAW filter 354 may be coupled to optional matching circuitry 355. The matching circuitry 355 may then be coupled to a low noise amplifier (LNA) 312. The low noise amplifier (LNA) 312 of FIG. 3 may be one configuration of the low noise amplifier (LNA) 112 of FIG. 1. The low noise amplifier (LNA) 312 may include differential inputs Vinp 358 and Vinn 360. The differential inputs Vinp 358 and Vinn 360 may be coupled to the matching circuitry 355. Each of the differential inputs Vinp 358 and Vinn 360 may be coupled to a source load 356c, 356d that is coupled to ground. Although the source load 356c, 356d is shown as inductors in the exemplary embodiment, the source load 356c, 356d may be an inductor, an LC (inductor-capacitor) circuit, a transformer, an NMOS transistor, a resistor, etc.

The exemplary low noise amplifier (LNA) 312 may also include differential outputs Voutp 357 and Voutn 359. Vinp 358 may be coupled to Voutp 357 via two metal oxide semiconductor field effect transistors (MOSFET) 361a, 361c. The MOSFETS 361a, 361c may each have an isolated substrate that can be independently biased to improve coupling and allow different back-gate bias levels. Voutp 357 may be coupled to a supply voltage via an exemplary load 356a. Vinn 360 may be coupled to Voutn 359 via two transistors 361b, 361d. Voutn 359 may be coupled to a supply voltage via an exemplary load 356b. The load 356a, 356b may be an inductor, an LC (inductor-capacitor) circuit, a transformer, a PMOS transistor, a resistor, etc. Voutn 359 and Voutp 357 may each be coupled to a mixer 316. The mixer 316 of FIG. 3 may be one configuration of the mixer 116 of FIG. 1. Usually, a mixer 316 is followed by a baseband filter that performs filtering of the signal as well as increases the gain to bring the output level to desired levels. Thus, the mixer 316 of FIG. 3 is shown as mixer+baseband 316.

The mixer 316 may be coupled to exemplary second-order intermodulation (IM2) detection and calibration circuitry 362 in second-order intermodulation (IM2) reduction circuitry 320. The second-order intermodulation (IM2) reduction circuitry 320 of FIG. 3 may be one configuration of the second-order intermodulation (IM2) reduction circuitry 120 of FIG. 1. The second-order intermodulation (IM2) detection and calibration circuitry 362 may produce a first feedback signal 363a and a second feedback signal 363b to reduce second-order intermodulation (IM2) distortion. The first feedback signal 363a may be fed back to the mixer 316 to adjust the bias level on the mixer gate in an exemplary embodiment. The second feedback signal 363b may be fed back to adjustable bias circuitry 364 to adjust the bias levels in the low noise amplifier (LNA) 312.

The adjustable bias circuitry 364 may generate differential bias signals Bias N 365 and Bias P 366. In an exemplary embodiment, Bias N 365 and Bias P 366 may each be a generated voltage signal. Normally, both of the differential legs of the low noise amplifier (LNA) 312 (i.e., Vinp 358 and Vinn 360) are biased similarly using the same replicated sources. An imbalance of the bias signals applied to each of the differential legs of the low noise amplifier (LNA) 312 (through calibration) may improve the second-order non-linearity of the low noise amplifier (LNA) 312. For example, the Bias N 365 signal and the Bias P 366 signal may be different. The Bias N output 369 may be coupled to Vinn 360 via a resistor 370 that introduces a voltage bias to the input stage of the low noise amplifier (LNA) 312. The Bias P output 368 may be coupled to Vinp 358 via a resistor 367 that also introduces a voltage bias to the input stage of the low noise amplifier (LNA) 312.

The imbalance in the bias signals may be introduced in many ways. In an exemplary embodiment such as common source configurations like FIG. 3, the imbalance in the bias signals may be introduced by creating a voltage imbalance at the input to the low noise amplifier (LNA) 312. In common gate configurations, the imbalance in the bias signals may be introduced by creating a current imbalance at the input to the low noise amplifier (LNA) 312. In common source configurations, the imbalance in the bias signals may also be introduced using cascode device adjustments, although this may be less effective in suppressing the second-order intermodulation (IM2) distortion. In cascode device adjustments, the gate voltages of the cascode devices may be adjusted to reduce second-order intermodulation (IM2). The impact of cascode device adjustments is much less than adjusting the bias levels for the input devices.

Thus, the exemplary second-order intermodulation (IM2) reduction circuitry 320 reduces second-order intermodulation (IM2) distortion due to the mixer 316, the low noise amplifier (LNA) 312 and the board. Existing solutions only account for the second-order intermodulation (IM2) distortion in the mixer 316 and do not reduce the second-order intermodulation (IM2) distortion due to the low noise amplifier (LNA) 312 and other circuitry prior to the mixer 316.

Figure 4:
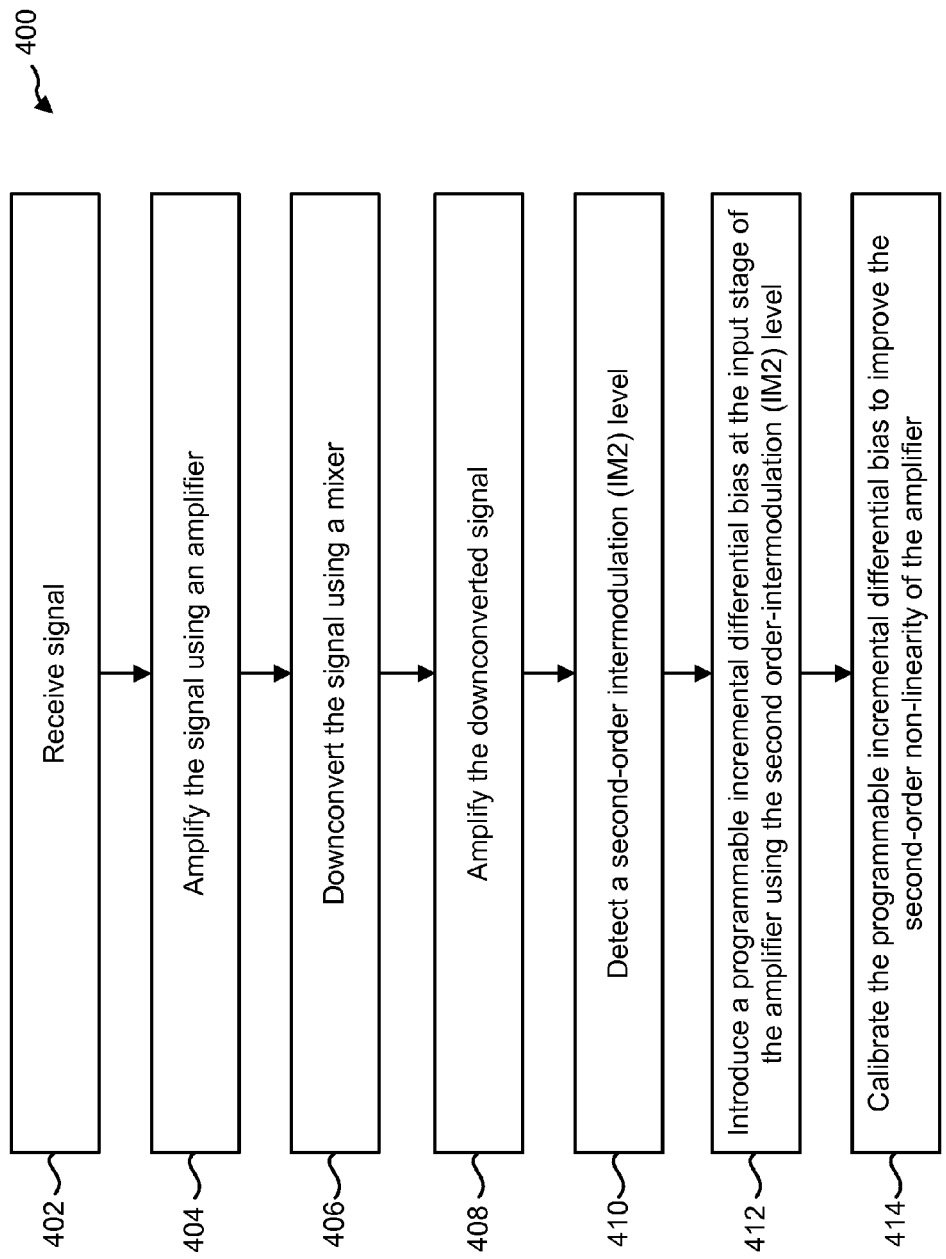
FIG. 4 is a flow diagram of a method for reducing second-order intermodulation (IM2) distortion in an exemplary receiver.

FIG. 4 is a flow diagram of a method 400 for reducing second-order intermodulation (IM2) distortion in an exemplary receiver 104. The method 400 may be performed by the receiver 104 on a wireless device 102. The receiver 104 may receive 402 a signal. The signal may be a radio frequency (RF) signal 110. The receiver 104 may amplify 404 the signal using an amplifier. In an exemplary embodiment, the amplifier may be a low noise amplifier (LNA) 112. The receiver 104 may then downconvert 406 the amplified signal using a mixer 116. The mixer 116 may translate the signal from one frequency to another. The receiver 104 may amplify 408 the downconverted signal using an amplifier 240. The receiver 104 may then detect 410 a second-order intermodulation (IM2) level.

The receiver 104 may introduce 412 an exemplary programmable incremental differential bias at the input stage of the amplifier using the second-order intermodulation (IM2) level. The programmable incremental differential bias may be a voltage imbalance provided to the differential inputs of the amplifier. For example, the programmable incremental differential bias may be the bias signals Bias N 365 and Bias P 366 discussed above in relation to FIG. 3. The receiver 104 may then calibrate 414 the programmable incremental differential bias to improve the second-order non-linearity of the amplifier. In an exemplary embodiment, the receiver 104 may adjust the imbalance between the Bias N 365 signal and the Bias P 366 signal to reduce the second-order intermodulation (IM2) distortion in the amplifier.

Calibrating 414 the programmable incremental differential bias may be performed using one of multiple methods. In an exemplary embodiment, field calibration may be used. Field calibration is preferred if the system includes a transmit signal (Tx) path. In field calibration, during boot-up (cold start), the frequency of the transmit signal (TX) path may be programmed to be at ½ of the receive signal (RX) path intended frequency at a specified power level. The signal amplitude at the output of the low noise amplifier (LNA) 112 may then be measured and the differential biasing may be adjusted until the second-order intermodulation (IM2) distortion product is minimized. The codes (i.e., the programming values for the input device bias levels) may be stored for future warm starts. After factory calibration, the code producing the lowest second-order intermodulation (IM2) distortion product may be stored so that field calibration is not necessary. Adjusting differential biasing is discussed below in relation to FIGS. 8-10.

Factory calibration at the chip level may also be performed, although this may be less preferred. In an exemplary embodiment of a factory test, an external single sinusoidal tone at ½ the frequency of the intended in-band signal may be applied to the input of the low noise amplifier 112. The output amplitude (which is due to second-order non-linearity) at the baseband filter output may then be measured and the bias levels Bias N 365 and Bias P 366 may be adjusted until the second-order intermodulation (IM2) distortion is minimized. The code may be stored in non-volatile memory. One disadvantage of performing factory calibration at the chip level is that board-level mismatches are not paired with the stored code so only internal (low noise amplifier (LNA) 112) second-order intermodulation (IM2) distortion will be addressed.

Factory calibration at the board-level may also be performed. In an exemplary embodiment of a factory test, an external single sinusoidal tone at ½ the frequency of the intended in-band signal may be applied at the input of the receiver 104. The output amplitude (which is due to second-order non-linearity) may then be measured at the output of the receiver 104. The code may be stored in non-volatile memory. In this case, the board-level as well as the chip-level mismatches are addressed and paired with the entire input path.

On-chip tone generation may also be used to calibrate the programmable incremental differential bias. This may require configuring an oscillator inside of the chip. On-chip tone generation can substitute for using an external tone generator. Furthermore, on-chip tone generation can be used during either field calibration or factory calibration.

Figure 5:
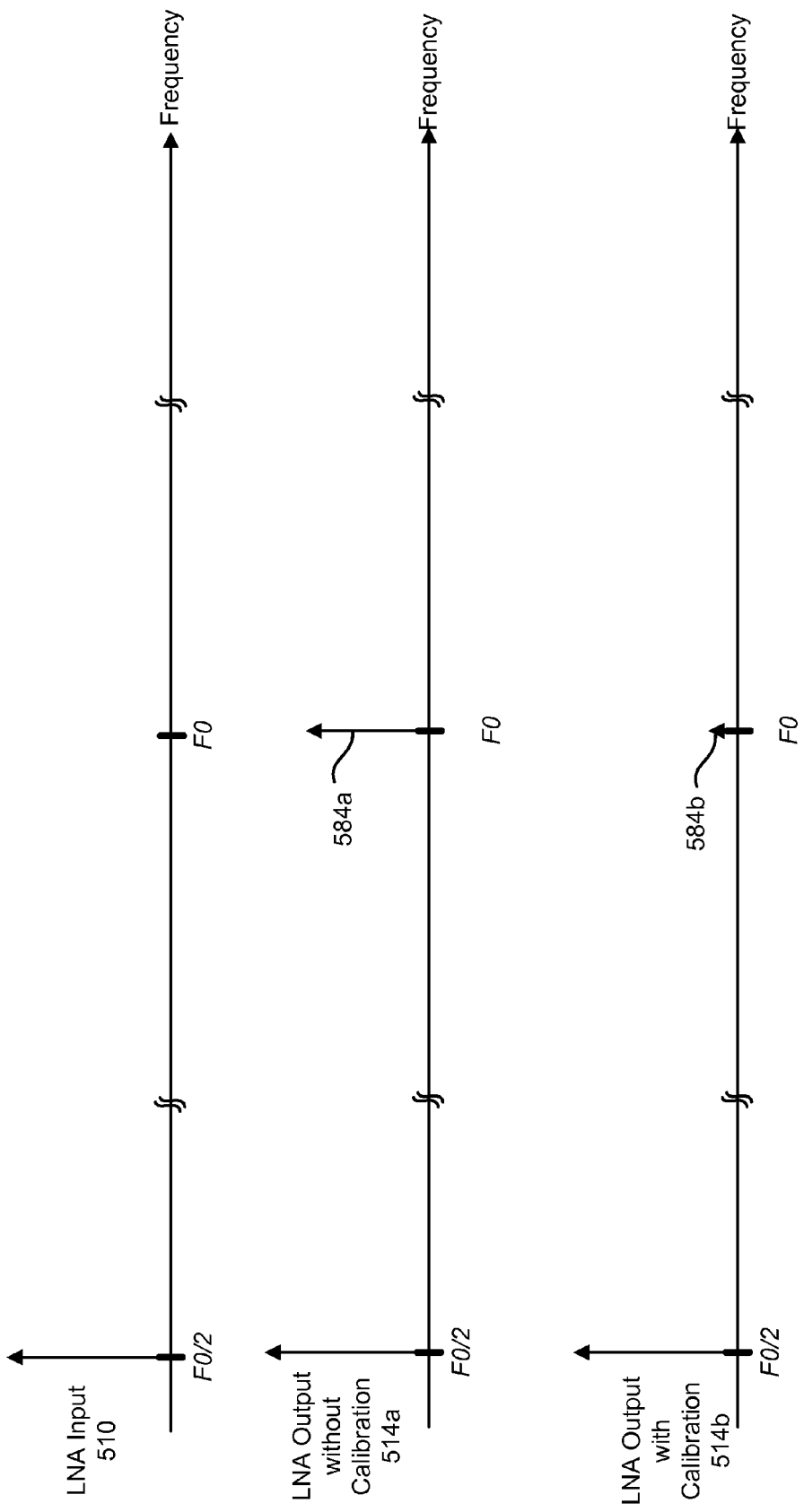
FIG. 5 shows exemplary low noise amplifier (LNA) input and output signals.

FIG. 5 shows exemplary low noise amplifier (LNA) input 510 and output 514$a$-$b$ signals. The low noise amplifier (LNA) input 510 may include two jammer signals, $\omega_1$ and $\omega_2$. The sum ($\omega_1+\omega_2$) or the delta ($\omega_1-\omega_2$) of the two jammer frequencies may be expressed as F0/2. When F0/2 is close to the in-band signal, the generated second-order intermodulation (IM2) distortion 584 can significantly degrade the sensitivity of the receiver 104.

Harmonics from the jammer frequencies (such as at F0) may cause second-order intermodulation (IM2) distortion 584$a$ at the low noise amplifier (LNA) output 514$a$ if no calibration is used. If calibration is used, the second order intermodulation (IM2) distortion 584 at the low noise amplifier (LNA) output 514$b$ may be reduced.

FIG. 6 shows an exemplary mixer input signal 570 and jammer frequencies 571. The jammer frequencies may be undesired signal components at a frequency of $\omega_1$ 571$b$ and $\omega_2$ 571$a$. The jammer frequencies 571 may correspond to signals transmitted by an interfering transmitter. The mixer input signal 570 may be a desired signal component centered at a frequency of $\omega_0$. The jammer frequencies 571 may be much higher in amplitude than the mixer input signal 570 and may be located close in frequency to the desired signal component.

When the sum ($\omega_1+\omega_2$) or the delta ($\omega_1-\omega_2$) of the two jammer frequencies 571 is close to the in-band signal, the generated second-order intermodulation (IM2) distortion can significantly degrade the sensitivity of the receiver 104. Harmonics from a jammer frequency 571 (e.g., $2\omega_2$) that are close to the in-band signal may also cause second-order intermodulation (IM2) distortion. The in-band second-order intermodulation (IM2) distortion from the low noise amplifier (LNA) 112 may be caused by an input imbalance (due to board and package-level mismatches), jammer levels (higher jammer levels cause higher second-order intermodulation (IM2) distortion levels during concurrency), circuit non-linearity (at the transistor level) and circuit mismatch (placement, routing and process variations in the differential path).

FIG. 7A shows the output of a mixer 116 without second-order intermodulation (IM2) cancellation. The output of the mixer 116 may be a baseband signal 118. Intermodulation components at $2\omega_2$ 674$a$, $\omega_1+\omega_2$ 674$b$ and $2\omega_1$ 674$c$ may be filtered out easily. Second-order intermodulation (IM2) distortion at $\omega_1-\omega_2$ 673 may overlap the output signal 672 of the mixer 116. The second-order intermodulation (IM2) distortion may be difficult to filter out since it is close to the desired signal component. The second-order intermodulation (IM2) distortion may act as additional noise that degrades the performance of the receiver 104.

FIG. 7B shows an exemplary output 772 of a mixer 116 with second-order intermodulation (IM2) cancellation. The output 772 of the mixer 116 may be a baseband signal 118. Intermodulation components at $2\omega_2$ 774$a$, $\omega_1+\omega_2$ 774$b$ and $2\omega_1$ 774$c$ may be filtered out easily. Second-order intermodulation (IM2) distortion 773 at $\omega_1-\omega_2$ has been reduced in the baseband signal 118. If the second-order intermodulation (IM2) cancellation is effective, the baseband signal 118 may be essentially free of second-order intermodulation (IM2) distortion and improved performance may be achieved for the exemplary receiver 104.

The input Vinp 358 to the low noise amplifier (LNA) 112 may be represented using Equation (1):

$$Vinp=0.5(A_1+\Delta A_1)\cos(\omega_1 t+\theta_1)+ 0.5(A_2+\Delta A_2)\cos(\omega_2 t+\theta_2). \quad (1)$$

$A_1$ is the magnitude of the first jammer 571$b$ at the low noise amplifier (LNA) 112 input. $A_2$ is the magnitude of the second jammer 571$a$ at the low noise amplifier (LNA) 112 input. $\Delta A_1$ is the magnitude mismatch of the first jammer 571$b$ between the two differential inputs Vinn 360 and Vinp 358 of the low noise amplifier (LNA) 112. $\Delta A_2$ is the magnitude mismatch of the second jammer 571$a$ between the two differential inputs Vinn 360 and Vinp 358 of the low noise amplifier (LNA) 112. $\omega_1$ is the frequency of the first jammer 571$b$ and $\omega_2$ is the frequency of the second jammer 571$a$. $\theta_1$ is the phase difference of the first jammer 571$b$ between the two differential inputs of the low noise amplifier (LNA) 112 and $\theta_2$ is the phase difference of the second jammer 571$a$ between the two differential inputs of the low noise amplifier (LNA) 112. $\Delta\theta=\theta_1-\theta_2$. The input Vinn 360 to the low noise amplifier (LNA) 112 may be represented using Equation (2):

$$Vinn=0.5(A_1)\cos(\omega_1 t)-0.5(A_2)\cos(\omega_2 t). \quad (2)$$

The second-order intermodulation (IM2) distortion level at the output Voutp 357 of the low noise amplifier (LNA) 112 may be calculated using Equation (3):

$$IM2@Voutp=0.5(\alpha_2+\Delta\alpha_2)(A_1+\Delta A_1)(A_2+\Delta A_2)\cos[(\omega_1-\omega_2)t+(\theta_1-\theta_2)] \quad (3)$$

$\alpha_2$ is the second-order non-linearity coefficient. $\Delta\alpha_2$ is the mismatch of $\alpha_2$ between the two low noise amplifier (LNA) 112 branches. The second-order intermodulation (IM2) distortion level at the exemplary output Voutn 359 of the low noise amplifier (LNA) 112 may be calculated using Equation (4):

$$IM2@Voutn=0.5\alpha_2(A_1)(A_2)\cos[(\omega_1-\omega_2)t] \quad (4)$$

The difference IM2@Vout,diff between the second-order intermodulation (IM2) distortion levels at the exemplary outputs Voutp 357 and Voutn 359 of the low noise amplifier (LNA) 112, IM2@Voutp and IM2@Voutn respectively, may be calculated using Equation (5):

$$IM2@Vout, diff = IM2@Voutp - IM2@Voutn = \left\{ \begin{bmatrix} 1-\cos\Delta\theta + \\ \left(\frac{\Delta A_1}{A_1}+\frac{\Delta A_2}{A_2}+\frac{\Delta A_1 \Delta A_2}{A_1 A_2}\right)\cos\Delta\theta \end{bmatrix} \cos(\omega_1-\omega_2)t - \\ \left(1+\frac{\Delta A_1}{A_1}+\frac{\Delta A_2}{A_2}+\frac{\Delta A_1 \Delta A_2}{A_1 A_2}\right)\sin\Delta\theta\sin(\omega_1-\omega_2)t \right\} \frac{\alpha_2}{4}A_1 A_2 + \quad (5)$$

-continued $$\frac{\alpha_2}{4}\frac{\Delta\alpha_2}{\alpha_2}A_1A_2\left(1+\frac{\Delta A_1}{A_1}+\frac{\Delta A_2}{A_2}+\frac{\Delta A_1\Delta A_2}{A_1A_2}\right)$$

$$\begin{bmatrix}\cos\Delta\theta\cos(\omega_1-\omega_2)t\\ -\sin\Delta\theta\sin(\omega_1-\omega_2)t\end{bmatrix}=$$

$$\frac{\alpha_2}{4}A_1A_2\alpha_{IM2,\Delta input}\cos[(\omega_1-\omega_2)t+\phi].$$

In Equation (5), $\alpha_{IM\ 2,\Delta input}\cos[(\omega_1-\omega_2)t+\phi]$ may be expressed using Equation (6):

$$\alpha_{IM2,\Delta input}\cos[(\omega_1-\omega_2)t+\phi]= \quad (6)$$

$$\begin{bmatrix}1-\left(1-\frac{\Delta\alpha_2}{\alpha_2}\right)\cos\Delta\theta+\\ \left(1+\frac{\Delta\alpha_2}{\alpha_2}\right)\left(\frac{\Delta A_1}{A_1}+\frac{\Delta A_2}{A_2}+\frac{\Delta A_1\Delta A_2}{A_1A_2}\right)\cos\Delta\theta\end{bmatrix}\cos(\omega_1-\omega_2)t-$$

$$\left(1+\frac{\Delta\alpha_2}{\alpha_2}\right)\left(1+\frac{\Delta A_1}{A_1}+\frac{\Delta A_2}{A_2}+\frac{\Delta A_1\Delta A_2}{A_1A_2}\right)\sin\Delta\theta\sin(\omega_1-\omega_2)t.$$

The above analysis shows that the in-band second-order intermodulation (IM2) distortion in the low noise amplifier (LNA) 112 has four contributors: input imbalance, jammer levels, circuit non-linearity and circuit mismatch. Surface acoustic wave (SAW) filter 354 rejection may be the most efficient second-order intermodulation (IM2) suppression method. However, when the surface acoustic wave (SAW) filter 354 reaches its physical limitation and circuit linearity reaches the power consumption limitation, the input imbalance becomes a dominant factor.

FIG. 8 is a circuit diagram illustrating exemplary biasing circuitry 822 for use in the present systems and methods. The biasing circuitry 822 of FIG. 8 may be one configuration of the biasing circuitry 122 of FIG. 1. The biasing circuitry 822 may include a variable current source 875, a transistor 876 and a resistor 877 in the illustrated configuration. The gate voltage of the transistor 876 may be individually programmed and the resistor 877 has no current across it, producing a bias voltage output (i.e., Bias N 365 or Bias P 366). The value of the exemplary variable current source 875 may be programmed by the second-order intermodulation (IM2) calibration circuitry 120.

FIG. 9 is a circuit diagram illustrating additional biasing circuitry 922 in an exemplary embodiment. The biasing circuitry 922 of FIG. 9 may be one configuration of the biasing circuitry 122 of FIG. 1. The biasing circuitry 922 may include a current source 978, a transistor 976, a variable resistor 979 and a resistor 977 in the illustrated configuration. The gate voltage of the transistor 976 may be individually programmed and the resistor 977 has no current across it, producing a bias voltage output.

FIG. 10 is a circuit diagram illustrating more biasing circuitry 1022 for use in the present systems and methods. The biasing circuitry 1022 of FIG. 10 may be one configuration of the biasing circuitry 122 of FIG. 1. The exemplary biasing circuitry 1022 may include a first variable resistor 1079a, a second variable resistor 1079b and a resistor 1077 in the illustrated configuration. The resistor 1077 has no current across it, producing a bias voltage output.

Figure 11:
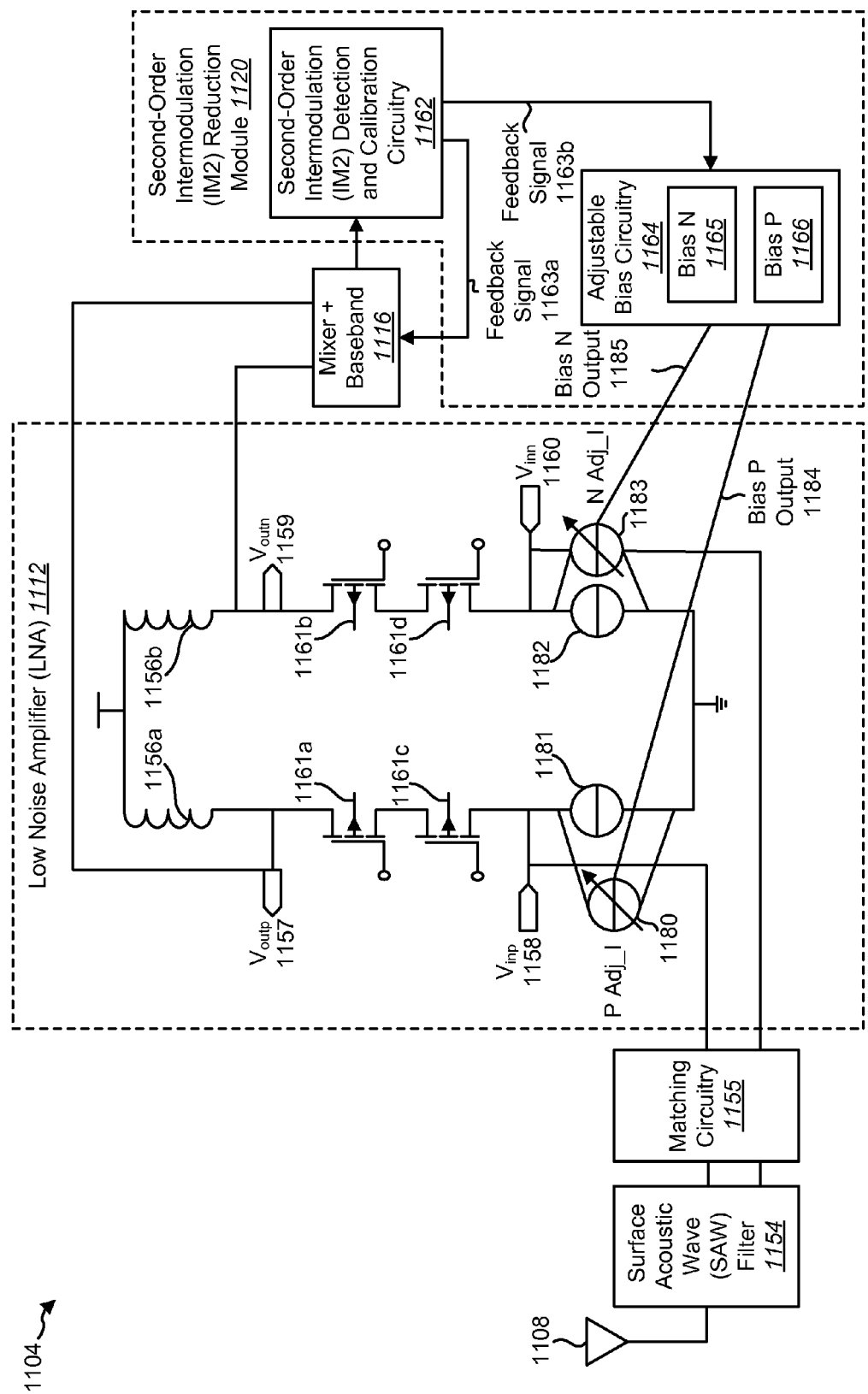
FIG. 11 is a block diagram illustrating another exemplary receiver for use in the present systems and methods.

FIG. 11 is a block diagram illustrating another exemplary receiver 1104 for use in the present systems and methods. The receiver 1104 of FIG. 11 may be one configuration of the receiver 104 of FIG. 1. The exemplary receiver 1104 may be calibrated by an introduction of a current imbalance to the input stage of a low noise amplifier (LNA) 1112. In an exemplary embodiment, the receiver 1104 may include an antenna 1108 that receives a radio frequency (RF) signal. A surface acoustic wave (SAW) filter 1154 may filter the received radio frequency (RF) signal.

The surface acoustic wave (SAW) filter 1154 may be coupled to matching circuitry 1155. The matching circuitry 1155 may then be coupled to a low noise amplifier (LNA) 1112. The low noise amplifier (LNA) 1112 of FIG. 11 may be one configuration of the low noise amplifier (LNA) 1112 of FIG. 1. The low noise amplifier (LNA) 1112 may include exemplary differential inputs Vinp 1158 and Vinn 1160. The differential inputs may be coupled to the matching circuitry 1155. The exemplary differential input Vinp 1158 may be coupled to ground via a constant current source 1181 that biases the input to the device. The exemplary differential input Vinn 1160 may also be coupled to ground via a constant current source 1182 that biases the input to the device.

In an exemplary embodiment, the low noise amplifier (LNA) 1112 may also include differential outputs Voutp 1157 and Voutn 1159. Vinp 1158 may be coupled to Voutp 1157 via two transistors 1161a, 1161c. Voutp 1157 may be coupled to a supply voltage via an inductor 1156a. Vinn 1160 may be coupled to Voutn 1159 via two transistors 1161b, 1161d. Voutn 1159 may be coupled to a supply voltage via an inductor 1156b. Voutn 1159 and Voutp 1157 may each be coupled to a mixer 1116. The mixer 1116 of FIG. 11 may be one configuration of the mixer 116 of FIG. 1. The mixer 1116 may include a baseband filter.

The mixer 1116 may be coupled to exemplary second-order intermodulation (IM2) detection and calibration circuitry 1162 in second-order intermodulation (IM2) reduction circuitry 1120. The second-order intermodulation (IM2) reduction circuitry 1120 of FIG. 11 may be one configuration of the second-order intermodulation (IM2) reduction circuitry 120 of FIG. 1. The exemplary second-order intermodulation (IM2) detection and calibration circuitry 1162 may produce a first feedback signal 1163a and a second feedback signal 1163b to reduce second-order intermodulation (IM2) distortion. The first feedback signal 1163a may be fed back to the mixer 1116 to adjust the bias level on the mixer gate. The second feedback signal 1163b may be fed back to adjustable bias circuitry 1164 to adjust the bias levels in the low noise amplifier (LNA) 1112.

The adjustable bias circuitry 1164 may generate differential bias signals Bias N 1165 and Bias P 1166. In an exemplary embodiment, Bias N 1165 and Bias P 1166 may each control a programmable current source that will improve the second-order intermodulation (IM2) performance. For example, a Bias P output 1184 may control a P Adj_I 1180 current source in parallel with the constant current source 1181. A Bias N output 1185 may control an N Adj_I 1183 current source in parallel with the constant current source 1182. Normally, both of the differential legs of the low noise amplifier (LNA) 1112 (i.e., Vinn 1160 and Vinp 1158) are biased similarly using the same replicated sources. An exemplary imbalance of the bias signals applied to each of the differential legs of the low noise amplifier (LNA) 1112 (through calibration) may improve the second-order non-linearity of the low noise amplifier (LNA) 1112. In an exemplary embodiment, the current source P Adj_I 1180 and the current source N Adj_I 1183 may each generate a different amount of current. As discussed above, the imbalance in the bias signals may be introduced by creating a current imbalance at the input to the low noise amplifier (LNA) 1112.

The exemplary second-order intermodulation (IM2) reduction circuitry 1120 reduces second-order intermodulation (IM2) distortion in the mixer 1116, the low noise amplifier (LNA) 1112 and in other circuitry before the mixer 1116 (e.g., the board). Existing solutions only account for the second-order intermodulation (IM2) distortion in the mixer 1116 and do not reduce the second-order intermodulation (IM2) distortion due to the low noise amplifier (LNA) 1112 and other circuitry prior to the mixer 1116.

Figure 12:
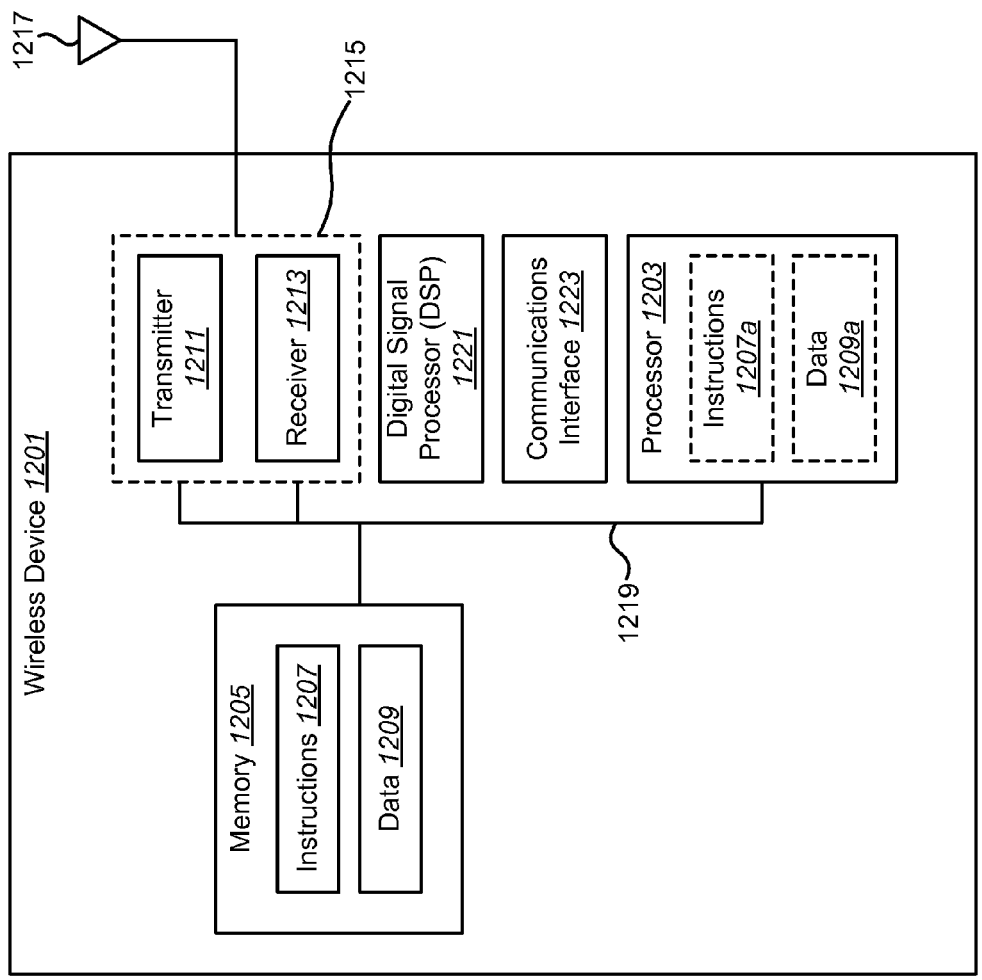
FIG. 12 illustrates certain components that may be included within a wireless device.

FIG. 12 illustrates certain components that may be included within an exemplary wireless device 1201. The wireless device 1201 may be a base station, an access point, a NodeB, an evolved NodeB, a wireless communication device, a user equipment (UE), an access terminal, etc. The wireless device 1201 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the wireless device 1201 of FIG. 12, in an alternative configuration, a combination of processors (e.g., an ARM and DSP) could be used.

The exemplary wireless device 1201 also includes memory 1205. The memory 1205 may be any electronic component capable of storing electronic information. The memory 1205 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1209 and instructions 1207 may be stored in the memory 1205. The instructions 1207 may be executable by the processor 1203 to implement the methods disclosed herein. Executing the instructions 1207 may involve the use of the data 1209 that is stored in the memory 1205. When the processor 1203 executes the instructions 1207, various portions of the instructions 1207*a* may be loaded onto the processor 1203, and various pieces of data 1209*a* may be loaded onto the processor 1203.

The exemplary wireless device 1201 may also include a transmitter 1211 and a receiver 1213 to allow transmission and reception of signals to and from the wireless device 1201 using an antenna 1217. The transmitter 1211 and receiver 1213 may be collectively referred to as a transceiver 1215. The exemplary wireless device 1201 may also include (not shown) multiple transmitters, multiple receivers and/or multiple transceivers. The exemplary wireless device 1201 may also include a digital signal processor (DSP) 1221 and a communications interface 1223.

The various components of the exemplary wireless device 1201 may be coupled together by one or more buses, which may include a power bus, a control signal bus, a status signal bus, a data bus, etc. For the sake of clarity, the various buses are illustrated in FIG. 12 as a bus system 1219.

Those of skill in the art would understand that information and signals may be represented using any of a variety of different technologies and techniques. For example, data, instructions, commands, information, signals, bits, symbols and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits and algorithm steps described in connection with the embodiments disclosed herein may be implemented as electronic hardware, computer software or combinations of both. To clearly illustrate this interchangeability of hardware and software, various illustrative components, blocks, modules, circuits and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read-Only Memory (ROM), Electrically Programmable ROM (EPROM), Electrically Erasable Programmable ROM (EEPROM), registers, hard disk, a removable disk, a CD-ROM or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 4, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A receiver for a wireless device, comprising:
   a low noise amplifier comprising differential inputs;
   a mixer coupled to the low noise amplifier; and
   a second-order intermodulation reduction circuitry coupled to an output of a stage subsequent to the low noise amplifier, wherein the second-order intermodulation reduction circuitry comprises adjustable bias circuitry that provides a first bias signal and a second bias signal based at least in part on a downconverted signal at an input stage of the low noise amplifier, the first bias signal and the second bias signal are configured as differential signals, the first bias signal and the second bias signal separately adjustable with respect to each other forming an imbalance between the first bias signal and the second bias signal.

2. The receiver of claim 1, wherein the stage subsequent to the low noise amplifier comprises the mixer.

3. The receiver of claim 1, the second-order intermodulation reduction circuitry comprising:
   a second-order intermodulation detection and calibration circuitry, wherein a first differential input of the differential inputs receives the first bias signal, and wherein a second differential input of the differential inputs receives the second bias signal.

4. The receiver of claim 3, wherein the first bias signal and the second bias signal are imbalanced through calibration.

5. The receiver of claim 3, wherein the first bias signal and the second bias signal create a current imbalance at the differential inputs of the low noise amplifier.

6. The receiver of claim 3, wherein the first bias signal and the second bias signal create a voltage imbalance at the differential inputs of the low noise amplifier.

7. The receiver of claim 3, wherein the second-order intermodulation reduction circuitry reduces second-order intermodulation distortion introduced to a received signal prior to the mixer.

8. The receiver of claim 3, wherein the second-order intermodulation reduction circuitry reduces second-order intermodulation distortion prior to the mixer caused by an imbalance in board matching components, routing and mismatch, and non-linearity in the low noise amplifier and a transconductance stage.

9. The receiver of claim 4, wherein performing calibration minimizes second-order intermodulation distortion.

10. The receiver of claim 9, wherein calibration comprises adjusting the imbalance between the first bias signal and the second bias signal.

11. The receiver of claim 1, further comprising:
a surface acoustic wave filter; and
a matching circuitry.

12. The receiver of claim 1, wherein a first differential output and a second differential output of the low noise amplifier are coupled to the mixer.

13. A method for reducing distortion in a receiver, the method comprising:
receiving a radio frequency signal;
amplifying the radio frequency signal using a low noise amplifier;
detecting a distortion level using a second-order intermodulation reduction circuitry that is coupled to an output of a stage subsequent to the low noise amplifier; and
introducing a first bias signal and a second bias signal based at least in part on a downconverted signal at an input stage of the low noise amplifier, wherein the first bias signal and the second bias signal are configured as differential signals, the first bias signal and the second bias signal separately adjustable with respect to each other forming an imbalance between the first bias signal and the second bias signal.

14. The method of claim 13, further comprising:
downconverting the amplified radio frequency signal; and
amplifying the downconverted signal.

15. The method of claim 13, wherein the distortion comprises a second-order intermodulation distortion.

16. The method of claim 15, wherein the radio frequency signal comprises second-order intermodulation distortion introduced prior to a mixer.

17. The method of claim 15, wherein an imbalance in board matching components, routing and mismatch, and non-linearity in the low noise amplifier and a transconductance stage causes the second-order intermodulation distortion.

18. The method of claim 15, wherein a first differential input of a low noise amplifier receives the first bias signal, and wherein a second differential input of the low noise amplifier receives the second bias signal.

19. The method of claim 18, wherein the first bias signal and the second bias signal create a current imbalance at a differential input of the low noise amplifier.

20. The method of claim 18, wherein the first bias signal and the second bias signal create a voltage imbalance at a differential input of the low noise amplifier.

21. The method of claim 15, wherein the calibration performed comprises a factory calibration at a chip level, the factory calibration at a chip level comprising:
applying an external single sinusoidal tone at a frequency half of a receive signal path intended frequency to a receiver input;
measuring an output amplitude at a receiver output;
adjusting differential biasing to minimize a second-order intermodulation distortion; and
storing codes associated with the adjusted differential biasing in memory.

22. The method of claim 18, wherein calibration adjusts the imbalance between the first bias signal and the second bias signal.

23. An apparatus configured for reducing distortion in a receiver, comprising:
means for receiving a radio frequency signal;
means for amplifying the radio frequency signal;
means for detecting a distortion level, wherein the means for detecting the distortion level are coupled to an output of a stage subsequent to the means for amplifying the radio frequency signal; and
means for introducing a first bias signal and a second bias signal based at least in part on a downconverted signal at a differential input of a low noise amplifier, wherein the first bias signal and the second bias signal are configured as differential signals, the first bias signal and the second bias signal separately adjustable with respect to each other forming an imbalance between the first bias signal and the second bias signal.

24. The apparatus of claim 23, further comprising:
means for downconverting the amplified radio frequency signal; and means for amplifying the downconverted signal.

25. The apparatus of claim 23, wherein the distortion comprises second-order intermodulation distortion.

26. The apparatus of claim 25, wherein the radio frequency signal comprises second-order intermodulation distortion introduced prior to a mixer.

27. The apparatus of claim 25, wherein an imbalance in board matching components, routing and mismatch, and non-linearity in the low noise amplifier and a transconductance stage causes the second-order intermodulation distortion.

28. The apparatus of claim 23, wherein a first differential input of the low noise amplifier receives the first bias signal, and wherein a second differential input of the low noise amplifier receives the second bias signal.

29. A computer-program product comprising a non-transitory computer-readable medium having instructions thereon, the instructions comprising:
code for causing a computer to receive a radio frequency signal;
code for causing a computer to amplify the radio frequency signal using a low noise amplifier;
code for causing a computer to detect a distortion level using a second-order intermodulation reduction circuitry that is coupled to an output of a stage subsequent to the low noise amplifier; and
code for causing a computer to introduce a first bias signal and a second bias signal based at least in part on a downconverted signal at a differential input of the low noise amplifier, wherein the first bias signal and the second bias signal are configured as differential signals, the first bias signal and the second bias signal separately adjustable with respect to each other forming an imbalance between the first bias signal and the second bias signal.

30. The computer-program product of claim 29, the instructions further comprising:
code for causing a computer to downconvert the amplified radio frequency signal; and
code for causing a computer to amplify the downconverted signal.

31. The computer-program product of claim 29, wherein the distortion comprises second-order intermodulation distortion.

32. The computer-program product of claim 31, wherein the radio frequency signal comprises second-order intermodulation distortion introduced prior to a mixer.

33. The computer-program product of claim 31, wherein an imbalance in board matching components, routing and mismatch, and non-linearity in the low noise amplifier and a transconductance stage causes the second-order intermodulation distortion.

34. The computer-program product of claim 29, wherein a first differential input of the low noise amplifier receives the first bias signal, and wherein a second differential input of the low noise amplifier receives the second bias signal.

35. The receiver of claim 1, wherein the imbalance of the first bias signal and the second bias signal is calibrated to improve the second order non-linearity of the low noise amplifier.

36. The method of claim 13, further comprising:
calibrating the imbalance of the first bias signal and the second bias signal to reduce distortion in the receiver by improving the second order non-linearity of the low noise amplifier.

37. The apparatus of claim 23, further comprising:
means for calibrating the imbalance of the first bias signal and the second bias signal to reduce distortion in the receiver by improving the second order non-linearity of the low noise amplifier.

38. The computer-program product of claim 29, the instructions further comprising:
code for causing a computer to calibrate the imbalance of the first bias signal and the second bias signal to reduce distortion in the receiver by improving the second order non-linearity of the low noise amplifier.

\* \* \* \* \*